United States Patent [19]
Clements et al.

[11] 3,970,868
[45] July 20, 1976

[54] PHASE COMPARATOR

[75] Inventors: Ivor K. Clements, Chelmsford; George R. Spencer, Needham, both of Mass.

[73] Assignee: Raytheon Company, Lexington, Mass.

[22] Filed: June 27, 1975

[21] Appl. No.: 590,894

[52] U.S. Cl. ............................. 307/232; 330/30 D
[51] Int. Cl.² ........................... H03K 5/20; H03F 3/45
[58] Field of Search ..................... 307/232; 330/30 D

[56] References Cited
UNITED STATES PATENTS

| | | | |
|---|---|---|---|
| 3,395,358 | 7/1968 | Petersen | 330/30 D |
| 3,519,841 | 7/1970 | Leinfelder | 307/332 |
| 3,740,456 | 6/1973 | Harwood | 307/232 X |
| 3,745,477 | 7/1973 | Freeborn | 330/30 D |
| 3,908,172 | 9/1975 | Aschermann et al. | 330/30 D |

*Primary Examiner*—John S. Heyman
*Attorney, Agent, or Firm*—Richard M. Sharkansky; Philip J. McFarland; Joseph D. Pannone

[57] ABSTRACT

A phase comparator suitable for integrated circuit fabrication is disclosed wherein each one of a pair of differential amplifiers periodically couples an input signal to the output of the comparator through a degenerative feedback arranged high gain amplifier selectively in accordance with a periodic reference signal. During one-half period of the reference signal, the input signal is coupled to the output of the comparator with a gain of substantially +1 and during the other half period of the reference signal the input signal is coupled to the output of the comparator with a gain of substantially −1. With such an arrangement the output voltage produced at the output of the phase comparator has an average value substantially proportional to the phase angle between the reference signal and the input signal. The use of a switched pair of differential amplifiers together with a degenerative feedback arranged high gain amplifier provides for a phase comparator suitable for integrated circuit fabrication.

4 Claims, 14 Drawing Figures

PHASE COMPARATOR

BACKGROUND AND SUMMARY OF THE INVENTION

This invention pertains generally to phase comparator circuitry and more particularly to phase comparator circuitry suitable for monolithic integrated circuit fabrication.

It is an object of this invention to provide an improved phase comparator circuit adapted for integrated circuit fabrication.

This and other objects of the invention are attained generally by providing, in combination: A first differential amplifier having a first input terminal adapted for coupling to an input signal source through a first input impedance, a second input terminal coupled to a predetermined voltage source, and a first output terminal; a second differential amplifier having first and second input terminals adapted for coupling to the input signal source through second and third input impedances, respectively, and a second output terminal coupled to the first output terminal; a high gain amplifier having an input coupled to the first and second output terminals and an output coupled in degenerative feedback to the first input terminal of the first differential amplifier through a first feedback impedance and also coupled in degenerative feedback to the first input terminal of the second differential amplifier through a second feedback impedance; and means responsive to a reference signal selectively to actuate the first differential amplifier to couple the input signal to the high gain amplifier through such first differential amplifier exclusively or to actuate the second differential amplifier to couple the input signal to the high gain amplifier through such second differential amplifier exclusively.

BRIEF DESCRIPTION OF THE DRAWINGS

For a more complete understanding of the invention, reference is now made to the following description of the accompanying drawings, in which:

FIG. 3 is a diagram of a circuit useful in understanding the operation of the phase comparator shown in FIG. 1;

FIG. 4 is also a diagram of a circuit useful in understanding the operation of the phase comparator circuit shown in FIG. 1;

DESCRIPTION OF THE PREFERRED EMBODIMENT

Figure 1:
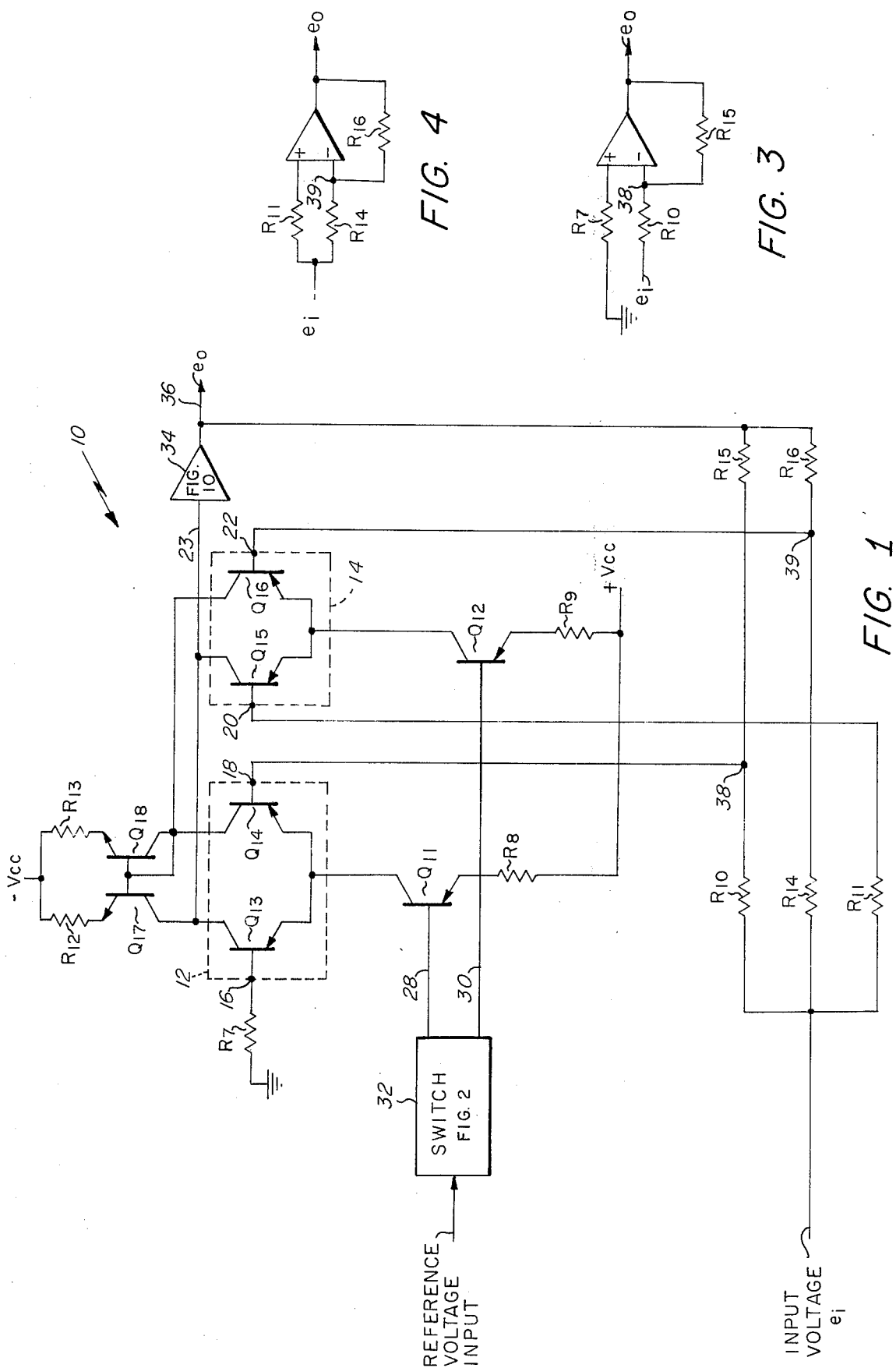
FIG. 1 is a schematic diagram of a phase comparator according to the invention.
Figure 5:
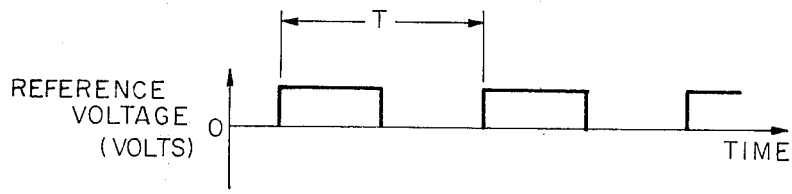
FIG. 5 is a curve showing the waveform of a reference voltage signal applied to the phase comparator shown in FIG. 1.
Figure 6A:
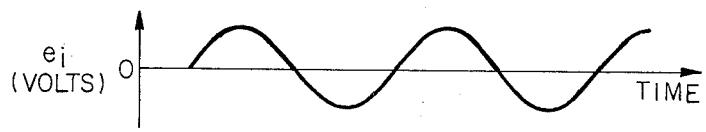
FIGS. 6A, 7A, 8A, 9A show different exemplary input voltage waveforms applied to the phase comparator circuit shown in FIG. 1, such waveforms having 0°, +90°, +180° and +270° phase relationships, respectively, with the reference voltage signal waveform shown in FIG. 5.
Figure 6B:
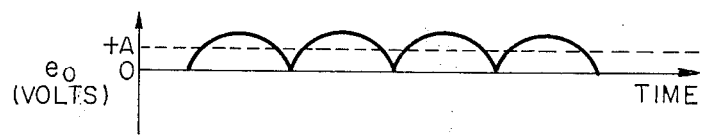
FIGS. 6B, 7B, 8B and 9B show the voltage waveforms produced at the output of the phase comparator when such phase comparator has the voltage waveforms shown in FIGS. 6A, 7A, 8A and 9A applied thereto, respectively.

Referring now to FIG. 1, a phase comparator 10 incorporating our concepts is shown to include a pair of "matched" differential amplifiers 12, 14. Each one of such amplifiers has, respectively, a pair of input terminals 16, 18 and 20, 22 and a common output (i.e. line 23) as shown. Each one of such pair of differential amplifiers 12, 14 is connected (in a manner to be described) between a $+V_{CC}$ supply and a $-V_{CC}$ supply so that one of the differential amplifiers is selected for operation in accordance with the signals on lines 28, 30. The signals on lines 28, 30 are supplied by a switch 32, the details of which will be described in connection with the explanation of FIG. 2. Suffice it to say here that, when a reference voltage having a periodic waveform as shown in FIG. 5 is supplied to the switch 32 during alternate half periods of such waveform, a pair of transistors $Q_{11}$, $Q_{12}$ is alternately actuated (by signals on lines 28, 30) thereby to complete the connection (through resistors $R_8$, $R_9$ and transistors $Q_{11}$, $Q_{12}$) of the differential amplifiers 12, 14 to the $+V_{CC}$, $-V_{CC}$ supplies via resistors $R_{12}$, $R_{13}$ and transistors $Q_{17}$, $Q_{18}$. It is noted that preferably transistors $Q_{11}$ and $Q_{12}$ are matched to provide matched current sources for the differential amplifiers 12, 14. It follows then that during one-half of the period of the reference voltage applied to switch 32, a voltage is produced on line 23 which is proportional to the difference in potential between the voltages applied to terminals 16, 18 of differential amplifier 12 and, during the other half of such period, a voltage is produced on line 23 which is proportional to the difference in potential of the voltages applied to terminals 20, 22 of differential amplifier 14. An input voltage, $e_i$, (the phase of which is to be compared with the phase of the reference voltage) is applied as shown: To terminal 18 of differential amplifier 12 (via an input resistor $R_{10}$); to terminal 20 of differential amplifier 14 (via an input resistor $R_{11}$); and to terminal 22 of differential amplifier 14 (via an input resistor $R_{14}$). The output of the actuated one of the pair of differential amplifiers 12, 14 is coupled, via line 23, to a high gain amplifier 34, the details of which will be described in connection with FIG. 10. The output of such high gain amplifier 34 provides the output voltage, $e_o$, of the phase comparator 10 on line 36. The signal on line 36 is coupled to resistor $R_{10}$ at terminal 38 via feedback resistor $R_{15}$ and also to terminal 39 via feedback resistor $R_{16}$. Terminal 38 is connected to terminal 18 of differential amplifier 12 and terminal 39 is connected to terminal 20 of differential amplifier 14, as shown. It is here noted that when differential amplifier 12 is actuated, the input voltage, $e_i$, may be considered as being applied to an operational amplifier having a feedback resistor $R_{15}$ and input resistor $R_{10}$ as shown in FIG. 3. Further, the "feedback loop" (i.e. the path from terminal 38 (FIG. 1) to terminal 18, transistor $Q_{14}$, transistor $Q_{13}$, high gain amplifier 34, feedback resistor $R_{15}$ back to terminal 38) has a 180° phase shift associated therewith and hence such "feedback loop" is a "negative" or degenerative loop. Further, because input terminal 16 of differential amplifier 12 is coupled to ground via resistor $R_7$, the ratio of the output voltage on line 36, $e_o$, to the input voltage $e_i$, may be represented as:

Eq. (1) $e_o/e_i = -R_{15}/R_{10}$ with, as here, $$R_{15} = R_{10}$$

$$e_o/e_i = -1,$$

the half periods of the reference voltage when differential amplifier 12 is actuated.

During the alternate half periods of the reference voltage, that is when the differential amplifier 14 is actuated, the input voltage, $e_i$, may be considered as being applied to one terminal of an operational amplifier via input resistor $R_{11}$ and to another terminal of such operational amplifier via input resistor $R_{14}$, such operational amplifier having degenerative feedback via feedback resistor $R_{16}$ as represented by the diagram shown in FIG. 4. (Here the feedback path is from terminal 39 to transistors $Q_{16}$, $Q_{15}$, high gain amplifier 34, feedback resistor $R_{16}$, back to terminal 39 (FIG. 1)). It follows then that the ratio of $e_o$ to $e_i$ may be represented as:

Eq. (2) $e_o/e_i = [R_{16}/R_{11} - R_{16}/R_{14}]$ with, as here, $$R_{16} = R_{14} = 2R_{11}$$

$$e_o/e_i = +1$$

during the periods of the reference voltage when differential amplifier 14 is actuated.

Figure 7A:
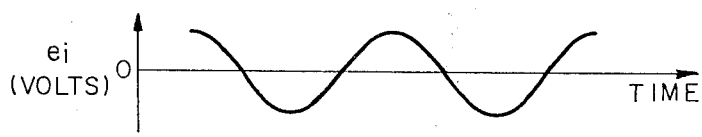
Figure 7B:
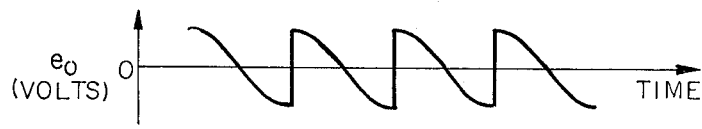
Figure 8A:
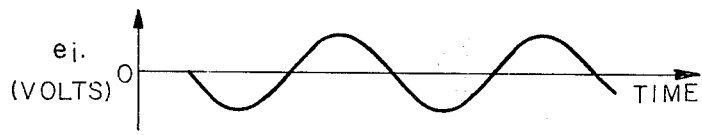
Figure 8B:
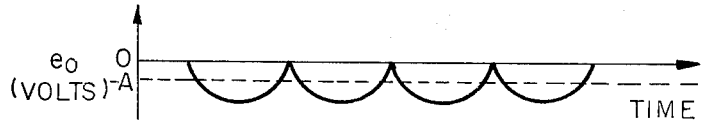
Figure 9A:
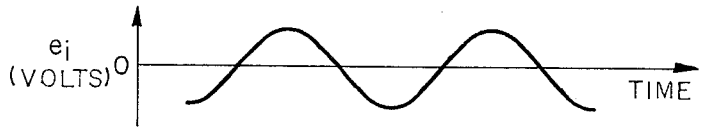
Figure 9B:
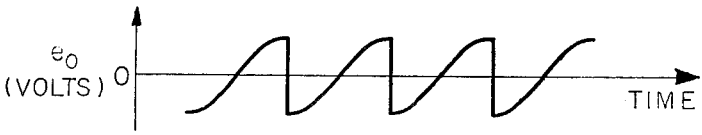

In summary, then, during successive half periods of the reference voltage the voltage, $e_o$, produced on line 36 (i.e. the output of the phase comparator 10) is substantially the input voltage, $e_i$, and during the second half period such output, $e_o$, is the negative of the input voltage, $e_i$. Common mode rejection of the reference voltage is accomplished by matching transistors $Q_{11}$ and $Q_{12}$ and differential amplifiers 12, 14 as described above. Such transistors and differential amplifiers are matched because such are here formed on a common monocrystalline semiconductor body (not shown). The signal at the output of comparator 36 varies in accordance with the phase angle between the input voltage, $e_i$, and the reference voltage when the periods of such voltages are substantially the same. This may be better understood by referring now to FIGS. 5, 6A – 6B, 7A – 7B, 8A – 8B and 9A – 9B. FIG. 5 shows a waveform of the reference voltage applied to switch 32 (FIG. 1), such waveform having a period, T. Let us here assume that durng the first half of such period the ratio of $e_o/e_i$ is substantially +1 and during the second half of such period the ratio $e_o/e_i$ is substantially −1. It follows then that with the input voltages, $e_i$, such as those shown in FIGS. 6A, 7A, 8A and 9A, corresponding output voltages, $e_i$, appear as shown in FIGS. 6B, 7B, 8B and 9B. That is, when the input voltage and the reference voltage are "in phase" the output voltage of the phase comparator 10, under such assumption, appears as that shown in FIG. 6B and may be considered as having an average value of +A volts. When the voltages are "180° out-of-phase" the output of the phase comparator 10 appears as shown in FIG. 8B and may be considered as having an average value of −A volts. When the voltages are ± 90° out-of-phase the output voltages of phase comparator 10 appears as shown in FIGS. 7B and 9B and may be considered as having an average value of 0 volts. A little thought will make it apparent that the average voltage produced at the output of the phase comparator 10 under such assumption is proportional to the cosine of the phase angle difference between the input voltage, $e_i$, and the reference voltage where such input voltage has a sinusoidal waveform.

Figure 2:
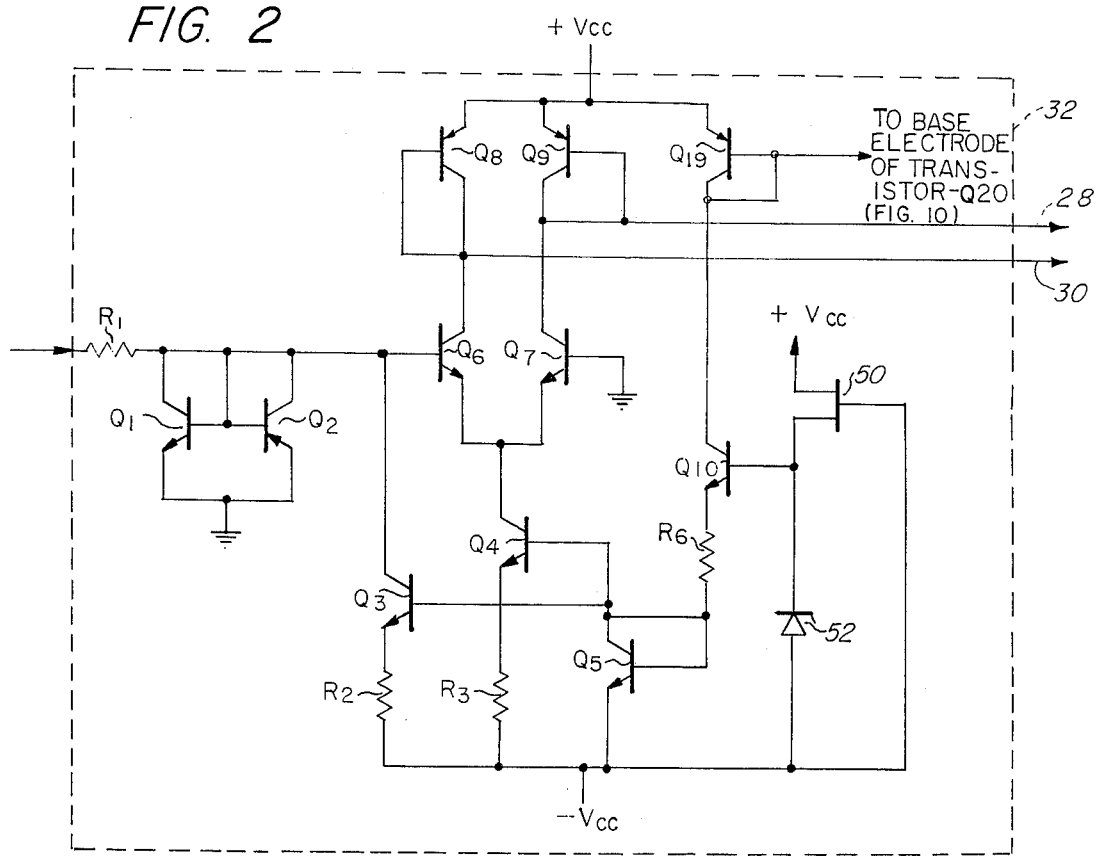
FIG. 2 is a schematic diagram of a switch used in the phase comparator network shown in FIG. 1.

Referring now to FIG. 2, switch 32 is shown to include a resistor $R_1$ adapted for coupling to the reference voltage source (not shown). Transistors $Q_1$, $Q_2$ are connected as diodes to limit the reference voltage (which may here be either a 9VRMS sinusoidal signal or a TTL periodic voltage signal) to ± 0.7 volts. When, during one-half of the period of the reference voltage, the voltage at the base electrode of transistor $Q_6$ is +0.7 volts, transistor $Q_6$ conducts, whereas transistor $Q_7$ is nonconductivve during this half period (because the base electrode of transistor $Q_7$ is at 0 volts), and current passes through line 30, diode connected transistor $Q_8$ (such transistor serving as a current source driver for transistor $Q_{12}$ (FIG. 1)), transistor $Q_4$ and resistor $R_3$, thereby to actuate differential amplifier 14 (FIG. 1) as described above. Conversely, when the voltage on the base electrode of transistor $Q_6$ is − 0.7 volts, that is during the other half period of the reference voltage, the base electrode of transistor $Q_7$ is more positive than the base electrode of transistor $Q_6$ and hence current flows through transistor $Q_7$ (whereas transistor $Q_6$ is nonconductive during this half period) and current passes through line 28, diode connected transistor $Q_9$ (such transistor serving as a current source driver for transistor $Q_{11}$ (FIG. 1)), resistor $R_3$ and transistor $Q_4$, thereby to actuate differential amplifier 12 (FIG. 1) as described above. Field effect transistor (FET) 50, zener diode 52, transistor $Q_{10}$ and resistor $R_6$ provide here 0.75 mA of current, through the current source drivers $Q_5$ and $Q_{19}$. It is here noted that FET 50 is here acting as a high voltage, so-called, "pinchoff" resistor. Transistor $Q_3$ and resistor $R_2$ enables the switch 32 to accommodate conventional TTL input signals by providing a current sink to the source of such TTL input signal source. In summary, then, during one-half of the period of the reference voltage current passes through line 28 and during the other half-period current passes through line 30.

Figure 10:
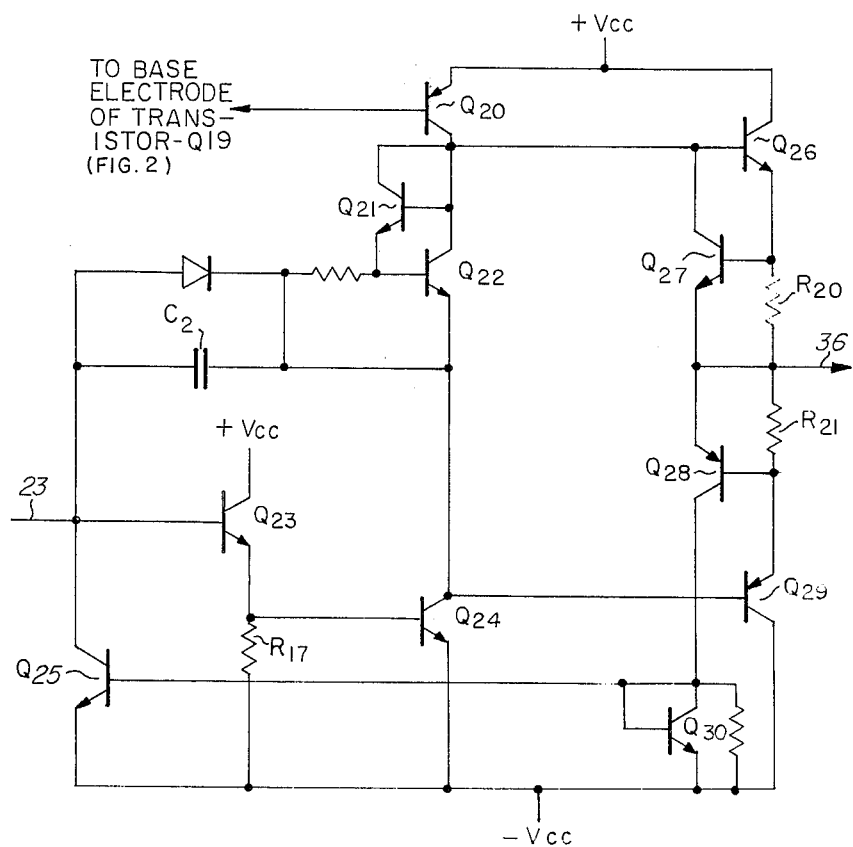
FIG. 10 is a schematic diagram of a high gain amplifier used in the phase comparator circuit shown in FIG. 1.

Referring now to FIG. 10, high gain amplifier 34 is shown. The output of the actuated one of the pair of differential amplifiers 12, 14 (FIG. 1) is coupled via line 23 to, inter alia, the base electrode of transistor $Q_{23}$. Such transistor $Q_{23}$ is connected as an emitter follower having a load resistor $R_{17}$ to drive transistor $Q_{24}$. The load for transistor $Q_{24}$ includes transistor $Q_{22}$ and a current source formed by transistor $Q_{20}$. It is here noted that the base electrode of transistor $Q_{20}$ is connected to the base electrode of transistor $Q_{19}$ (FIG. 2)). This arrangement provides a relatively large single stage gain. Transistor $Q_{24}$ drives transistor $Q_{29}$ directly and drives transistor $Q_{26}$ indirectly via level shift provided by $Q_{20}$, $Q_{21}$ and $Q_{22}$. It is noted that if the output, line 36, of the comparator 10 (FIG. 1) is shorted to ground there will be a large voltage drop across the resistor $R_{20}$ which thereby will forward bias transistor $Q_{27}$ and tend to cut off output transistor $Q_{26}$. Also, if there is a large negative current through transistor $R_{21}$, transistor $Q_{28}$ will become forward biased and current will start to flow through transistor $Q_{30}$. This forward biases transistor $Q_{25}$ which in turn pull the base electrode of transistor $Q_{23}$ towards $-V_{CC}$ to thereby tend to turn transistor $Q_{24}$ off. Thus, the output of high gain amplifier 34 rises, reducing the negative current, and the high gain amplifier 34 is short circuit protected. Frequency compensation is provided by capacitor $C_2$.

In a preferred embodiment, and referring to FIG. 1:

$R_7 = R_{11} = 6K$ ohms $R_{10} = R_{14} = R_{15} = R_{16} = 12K$ ohms $R_{12} = R_{13} = 5K$ ohms $R_8 = R_9 = 780$ ohms Having described a preferred embodiment of the invention, it will now be apparent to one of skill in the art that various changes may be made without departing from our inventive concepts. For example, while the circuitry described above has been shown to provide a phase comparator circuit, such circuitry may provide synchronous rectification by using as both the reference voltage input and the input voltage signal a common sinusoidal signal. Further, such circuitry may be used for various "steering" functions as when it is desired to pass the input voltage signal to the output line 36 with one polarity during one period of time and with an opposite polarity during a second period of time at the control of the signal applied to switch 32. Still further, because of the described characteristics of the disclosed circuitry such circuitry may be used as a mixer. It is felt, therefore, that this invention should not be restricted to its disclosed embodiment but rather should be limited only by the spirit and scope of the appended claims.

What is claimed is:

1. An electronic circuit comprising:

a. a first differential amplifier having an input terminal adapted for coupling to an input signal source through a first impedance and a first output terminal;

b. a second differential amplifier having first and second input terminals adapted for coupling to the input signal source through second and third input impedances, respectively; and a second output terminal connected to the first output terminal;

c. a high gain amplifier having an input coupled to the first and second output terminals and an output coupled in degenerative feedback to the input terminal of the first differential amplifier through a first feedback impedance and also coupled in degenerative feedback to the first input terminal of the second differential amplifier through a second feedback impedance; and d. switching means, responsive to a reference signal, selectively to actuate the first differential amplifier to couple the input signal to the high gain amplifier through such first differential amplifier or to actuate the second differential amplifier to couple the input signal to the high gain amplifier through such second differential amplifier.

2. The electronic circuit recited in claim 1 wherein each one of the pair of differential amplifiers includes a pair of matched transistors.

3. The electronic circuit recited in claim 2 wherein the pair of transistors in each one of the pair of differential amplifiers is coupled to a selected one of a pair of matched current sources in response to the switching means.

4. The electronic circuit recited in claim 3 wherein such circuit is formed on a common monocrystalline semiconductor body.

* * * * *